United States Patent
Corisis et al.

(10) Patent No.: US 7,659,151 B2
(45) Date of Patent: Feb. 9, 2010

(54) FLIP CHIP WITH INTERPOSER, AND METHODS OF MAKING SAME

(75) Inventors: David J. Corisis, Nampa, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 470 days.

(21) Appl. No.: 11/734,497

(22) Filed: Apr. 12, 2007

(65) Prior Publication Data

US 2008/0251943 A1 Oct. 16, 2008

(51) Int. Cl.
H01L 21/50 (2006.01)
H01L 23/29 (2006.01)

(52) U.S. Cl. .................. 438/126; 257/795; 257/783
(58) Field of Classification Search .............. 257/684, 257/783, 787–795; 438/121–127
See application file for complete search history.

(56) References Cited

U.S. PATENT DOCUMENTS

| | | | |
|---|---|---|---|
| 6,177,725 B1 | 1/2001 | Yamada et al. | |
| 6,210,992 B1 | 4/2001 | Tandy et al. | 438/106 |
| 6,265,766 B1 * | 7/2001 | Moden | 257/678 |
| 6,268,649 B1 | 7/2001 | Corisis et al. | 257/686 |
| 6,294,825 B1 | 9/2001 | Bolken et al. | 257/676 |
| 6,329,220 B1 | 12/2001 | Bolken et al. | 438/106 |
| 6,339,253 B1 | 1/2002 | Corisis | 257/676 |
| 6,372,552 B1 | 4/2002 | Kinsman et al. | 438/124 |
| 6,376,277 B2 | 4/2002 | Corisis | 438/106 |
| 6,414,391 B1 | 7/2002 | Corisis et al. | 257/738 |
| 6,461,897 B2 | 10/2002 | Lin et al. | 438/109 |
| 6,462,274 B1 | 10/2002 | Shim et al. | 174/52.4 |
| 6,518,654 B1 | 2/2003 | Bolken et al. | 257/678 |
| 6,563,205 B1 | 5/2003 | Fogal et al. | 257/686 |
| 6,576,496 B1 | 6/2003 | Bolken et al. | 438/110 |
| 6,624,504 B1 | 9/2003 | Inoue et al. | 257/668 |
| 6,683,374 B2 | 1/2004 | Goller et al. | 257/686 |
| 6,707,143 B2 | 3/2004 | Fujimoto et al. | 257/686 |
| 6,710,455 B2 | 3/2004 | Goller et al. | 257/777 |
| 6,791,195 B2 * | 9/2004 | Urushima | 257/783 |
| 6,875,921 B1 | 4/2005 | Conn | |
| 7,057,283 B2 | 6/2006 | Inoue et al. | 257/737 |

(Continued)

FOREIGN PATENT DOCUMENTS

WO WO-9907014 A1 2/1999

(Continued)

OTHER PUBLICATIONS

Capaote and Zhu, "No-Underfill Flip-Chip Encapsulation," SMTA Conference Proceedings, pp. 291-294, Aug. 23, 1998.

(Continued)

Primary Examiner—Calvin Lee
(74) Attorney, Agent, or Firm—Perkins Coie LLP (57) ABSTRACT

A device is disclosed which includes a die comprising an integrated circuit and an interposer that is coupled to the die, the interposer having a smaller footprint than that of the die. A method is disclosed which includes operatively coupling an interposer to a die comprising an integrated circuit, the interposer having a smaller footprint than that of the die, and filling a space between the interposer and the die with an underfill material.

26 Claims, 5 Drawing Sheets

U.S. PATENT DOCUMENTS

| | | | |
|---|---|---|---|
| 2001/0037892 A1 | 11/2001 | Corisis | 174/52.1 |
| 2002/0053736 A1 | 5/2002 | Corisis | 257/730 |
| 2002/0172024 A1 | 11/2002 | Hui et al. | 361/767 |
| 2004/0150088 A1 | 8/2004 | Corisis | 257/684 |

FOREIGN PATENT DOCUMENTS

| | | |
|---|---|---|
| WO | WO-9917364 A1 | 4/1999 |

OTHER PUBLICATIONS

International Search Report and Written Opinion for PCT/US2008/059912, Jul. 24, 2008.

\* cited by examiner

FLIP CHIP WITH INTERPOSER, AND METHODS OF MAKING SAME

BACKGROUND OF THE INVENTION

1. Technical Field

This subject matter disclosed herein is generally directed to the field of packaging of integrated circuit devices, and, more particularly, to a packed flip chip with an interposer, and various methods of making same.

2. Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframe (IDF). Some semiconductor device assemblies are connected to a substrate, such as a circuit board, prior to encapsulation. Manufacturers are under constant pressure to reduce the size of the packaged integrated circuit device and to increase the packaging density in packaging integrated circuit devices.

There are many applications where a plurality of integrated circuit die are attached to a single module that is commonly referred to as a multi-chip module. In some cases, traditional flip chip techniques have been employed to electrically couple an integrated circuit die to the module. In some cases, after the die is attached to the module, an underfill material is positioned between the integrated circuit die and the module in an effort to enhance the stability of the conductive connection between the integrated circuit die and the multi-chip module. The underfill material is typically applied by dispensing a quantity of the underfill material and allowing it to wick under the integrated circuit die and fill the space between the die and the multi-chip module. Thereafter, the underfill material is cured. The use of such underfill material can be time-consuming and expensive, especially if it is required on large surface areas.

BRIEF DESCRIPTION OF THE DRAWINGS

The invention may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

In the interest of clarity, the specification does not include a detailed description of all features of an actual implementation of the devices and methods disclosed herein. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 1:
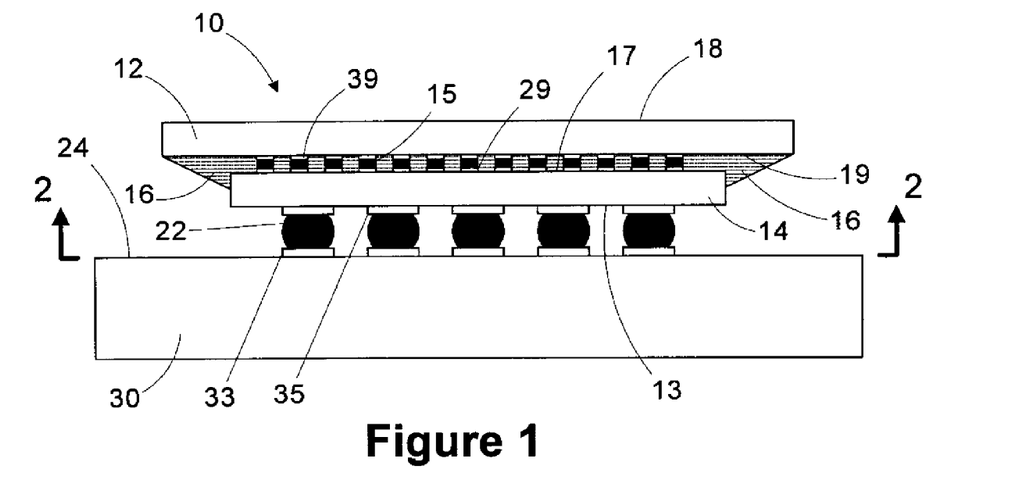
FIGS. 1 and 2 depict various views of an embodiment of an integrated circuit die and interposer described herein.
Figure 2:
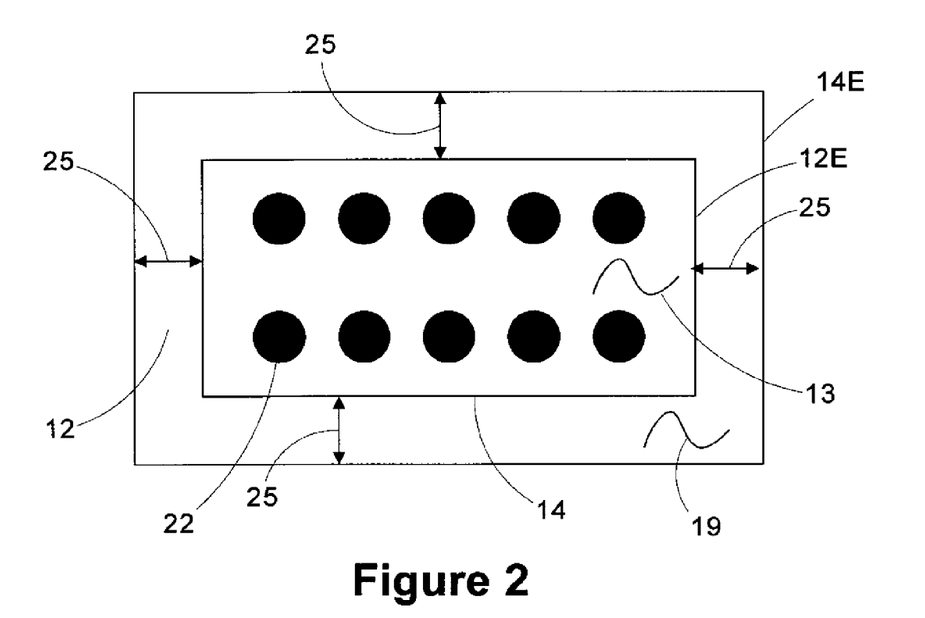

FIGS. 1 and 2 are, respectively, a cross-sectional and a bottom view of a device 10 comprising an integrated circuit die 12 that is conductively coupled to an interposer 14 by a plurality of conductive structures 15, e.g., solder balls, etc. An underfill material 16 fills the open regions between the die 12 and the interposer 14. The underfill material has been omitted from FIG. 2 for purposes of clarity. In the depicted embodiment, the backside 18 of the die 12 is exposed. However, the backside 18 could be covered with a packaging material, e.g., mold compound, tape, a polymer coating, etc., in other applications. The surface 17 of the interposer 14 is positioned opposite the surface 19 of the die 12. A plurality of conductive structures 22, e.g., solder balls, are conductively coupled to a plurality of bond pads 35 formed on the surface 13 of the interposer 14.

Figure 3:
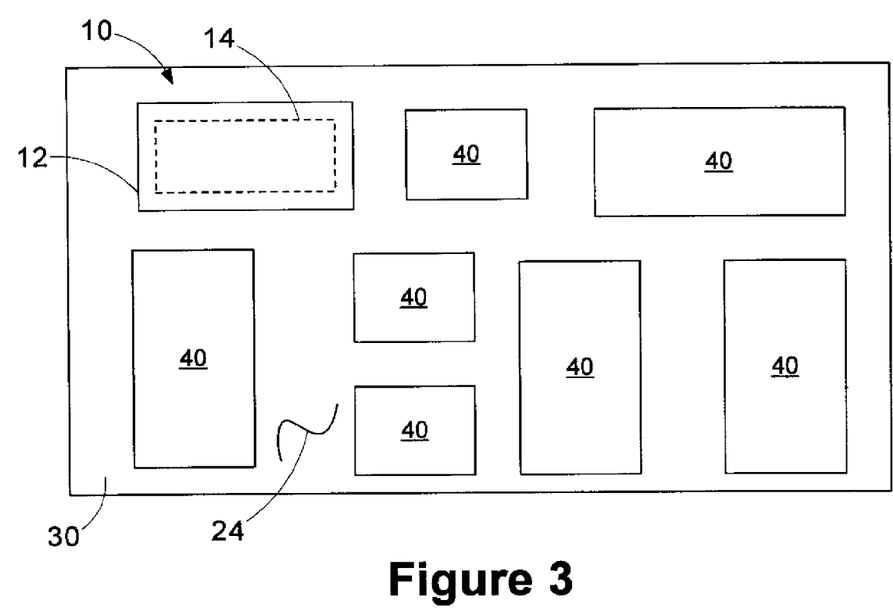
FIG. 3 is a plan view of an illustrative multi-chip module.

In the depicted embodiment, the device 10 is conductively coupled to a mounting surface 24 of an illustrative printed circuit board 30. In one example, the printed circuit board 30 is part of a multi-chip module. More specifically, the conductive structures 22, e.g., solder balls, engage illustrative bond pads 33 on the printed circuit board 30. As shown in FIG. 3, the device 10 may be mounted on the printed circuit board 30 along with a plurality of other schematically depicted integrated circuit die 40. Of course, the exact number and type of integrated circuit die 40 mounted on the printed circuit board 30 will vary depending upon the particular application.

As best seen in FIG. 2, the interposer 14 has a smaller footprint or horizontal surface area than that of the die 12. A major surface 19, e.g., a horizontal surface, of the die 12 defines a first area, while a major interposer surface 17 or 13, e.g., a horizontal surface, defines a second area, wherein the second area is less than the first area. In the depicted embodiment, the interposer 14 is symmetrically positioned on the die 12 such that there is a uniform spacing 25 between the edge of the interposer 14 and the projected edge of the die 12. The magnitude of the spacing 25 will vary depending upon the particular application. In one illustrative example, the spacing 25 may range from 0.1-1 mm. It should be understood that the spacing 25 need not be uniform, e.g., the interposer 14 need not be located symmetrically on the die 12. For example, one edge 14E of the interposer 14 may be substantially aligned with an edge 12E of the die 12. Other non-symmetrical arrangements of the interposer 14 relative to the die 12 are also possible.

As indicated above, the device depicted in FIGS. 1 and 2 is intended to be representative in nature. For example, the integrated circuit die 12 may be comprised of all or a portion of a variety of different kinds of integrated circuit devices, e.g., a memory device, a logic device, a microprocessor, an application-specific integrated circuit (ASIC), etc. Similarly, the conductive structures 15 between the die 12 and the interposer 14 may be provided by any of a variety of known structures or techniques. For example, a wiring pattern, e.g., a redistribution layer, (not shown) may be formed on the surface 19 of the die 12 and coupled to a plurality of bond pads 39. The conductive structures 15, e.g., solder balls, may be coupled to the bond pads 39 of the die 12 using known techniques. The conductive structures 15 are arranged in a pattern such that they match corresponding bond pads 29 on the surface 17 of the interposer 14. Of course, the electrical connection between the die 12 and the interposer 14 may be accomplished using any of a variety of techniques, e.g., gold-to-gold bonds, etc.

In a similar vein, the conductive structures 22 may be any type of structure that enables the interposer 14 to be electrically coupled to the mounting surface 24 of the printed circuit board 30. In the depicted embodiment, the conductive structures 22 are a plurality of solder balls that are coupled to illustrative bond pads 35 formed on the interposer 14. In one example, the conductive structures 22, e.g., solder balls, are sized and configured such that an underfill material is not required between the interposer 14 and the printed circuit board 30. For example, the conductive structures 22 may be configured as a traditional ball grid array (BGA), and the balls 22 may have a diameter of approximately 420-450 µm. The bond pads 33 and 35 may be relatively large, e.g., they may have a diameter of approximately 330-350 µm. The interposer 14 may be comprised of a variety of different materials depending upon the particular application, e.g., bismalemide triazine (BT), FR4, FR5, etc. The thickness of the interposer 14 may also vary depending upon the particular application, e.g., 100-300 µm.

Figure 4:
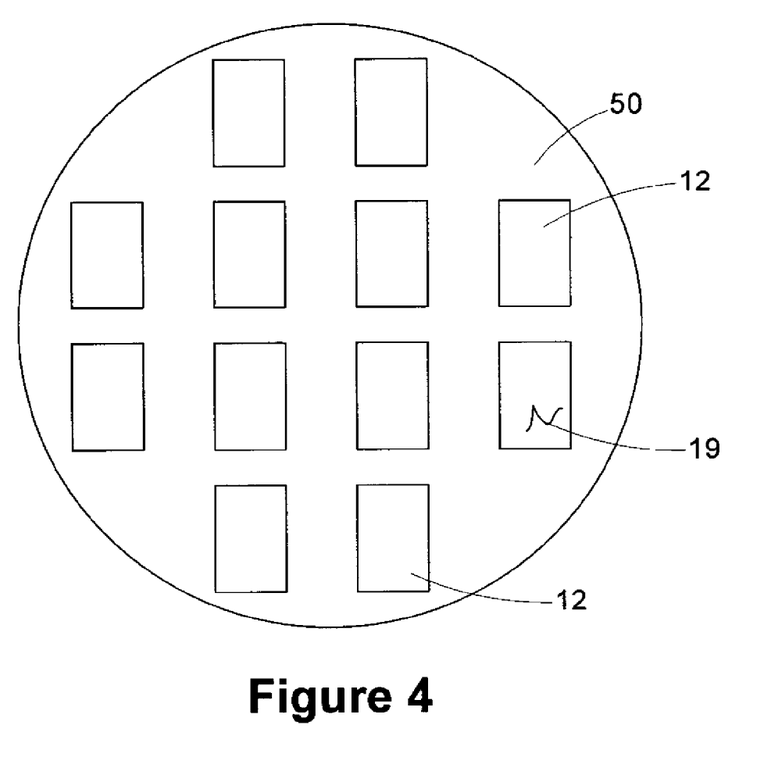
FIGS. 4-9 depict an illustrative process flow for forming the device disclosed herein.
Figure 5:
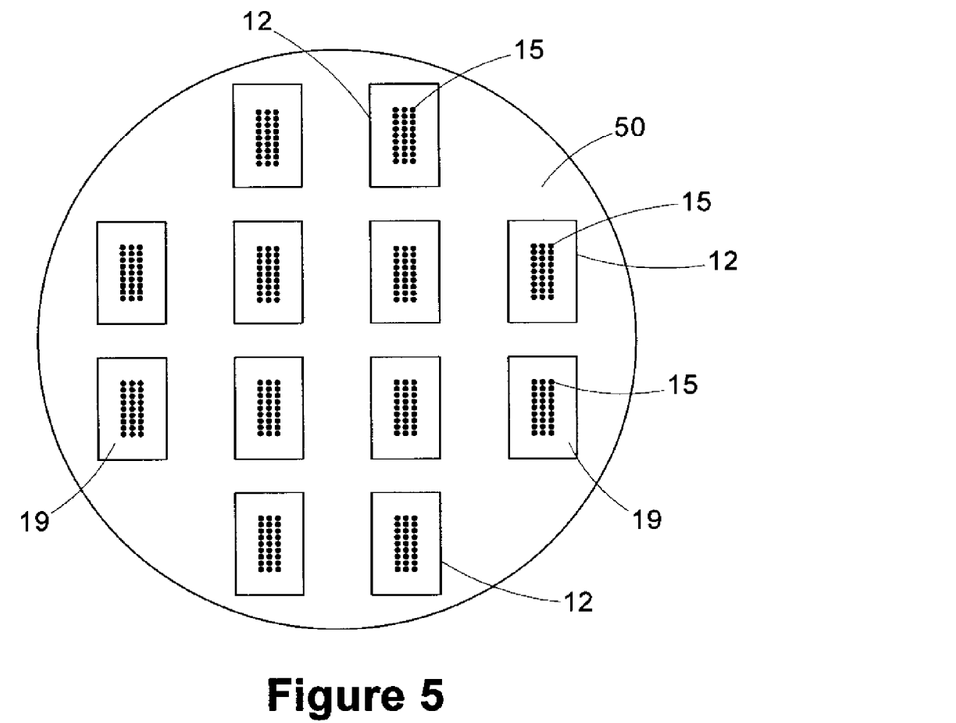

One illustrative technique for making the device 10 will now be described with reference to FIGS. 4-9. FIG. 4 depicts an illustrative semiconducting substrate or wafer 50 comprised of a plurality of illustrative integrated circuit die 12. For purposes of clarity, only twelve such die 12 are depicted in FIG. 4. In actual practice, there may be hundreds of such die 12, e.g., 300-600 die, formed on the substrate 50. The die 12 depicted in FIG. 4 are at the stage of manufacture just prior to the point in time where the conductive structures 15, e.g., solder balls, are formed on the die 12. As set forth above, the exact nature of the conductive structures 15 may vary depending upon the particular application. For example, a redistribution layer (not shown) may be formed on the die 12 to electrically couple bond pads (not shown) on the die 12 and the solder balls 15 that are formed after the redistribution layer is formed. FIG. 5 depicts the substrate 50 after a plurality of schematically depicted conductive structures 15, e.g., solder balls, have been formed above the surface 19 of the die 12. As mentioned above, any of a variety of different types of conductive structures 15 may be formed on the die 12 to permit the die 12 to be electrically coupled to another structure, such as the interposer 14, and such conductive structures 15 may be formed using a variety of known techniques. After the illustrative conductive structures 15 are formed, the individual die 12 may be subjected to various electrical tests to determine which die are acceptable (known-good-die) and those that are not (bad-die).

Figure 6:
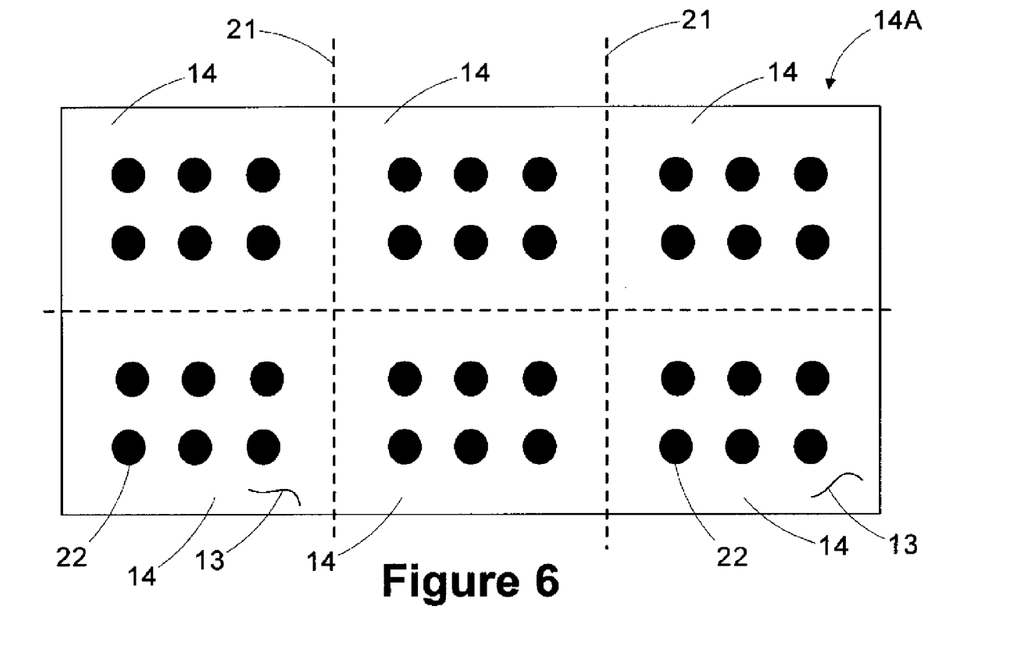
Figure 7:
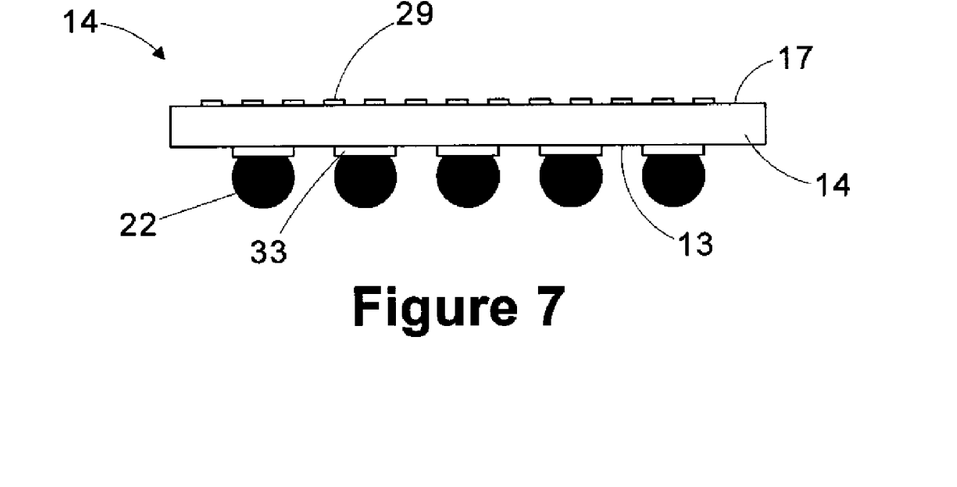

FIG. 6 is a plan view of a panel 14A from which a plurality of interposers 14 will be manufactured by cutting the panel along cut lines 21. FIG. 7 is a cross-sectional view of one embodiment of the interposer 14 after it is cut from the panel 14A. In one embodiment, the conductive structures 22, e.g., solder balls, are formed on the bond pads 35 on the surface 13 while the interposers 14 are still in the form of the panel 14A. After the formation of the conductive structures 22, the panel 14A may be cut along the illustrative cut lines 21.

Figure 8:
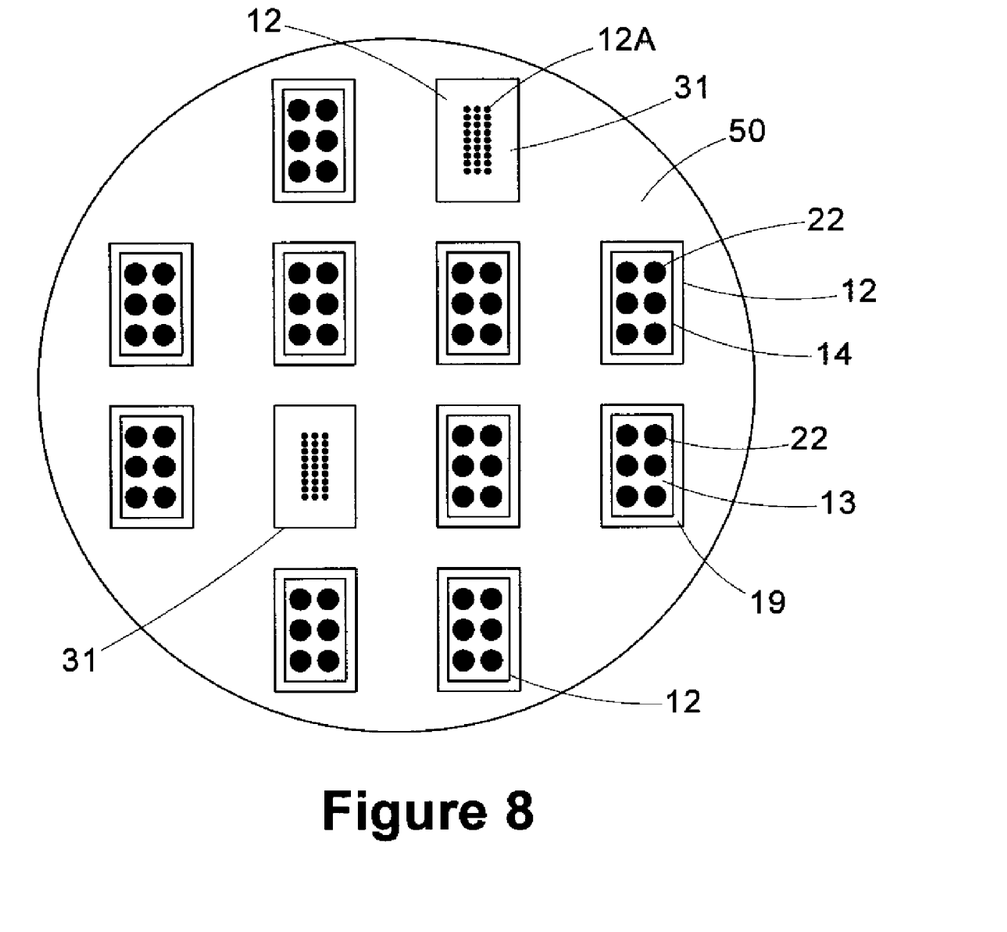

Next, as shown in FIG. 8, an individual interposer 14 (shown in FIG. 7) is placed on each of the die 12 on the substrate 50. The interposers 14 are only placed on known-good die. In the example depicted in FIG. 8, the die 31 are bad-die, i.e., die that failed one or more electrical tests. An interposer 14 is not positioned over the bad die 12. Prior to positioning the individual interposers 14 on the known-good-die 12, a flux material may be applied to the die 12 to insure a wetable surface for the attachment between the bond pads 29 on the surface 17 and the conductive structures 15 on the die 12. After the interposers 14 are attached to the known-good-die, a reflow process is performed to reflow the solder bumps 15 and thereby establish electrical connection between the die 12 and the interposer 14. Alternatively, an interposer 14 could be placed on the bad die 31 so as to insure a more uniform flow of the underfill material to be applied as described more fully below.

Figure 9:
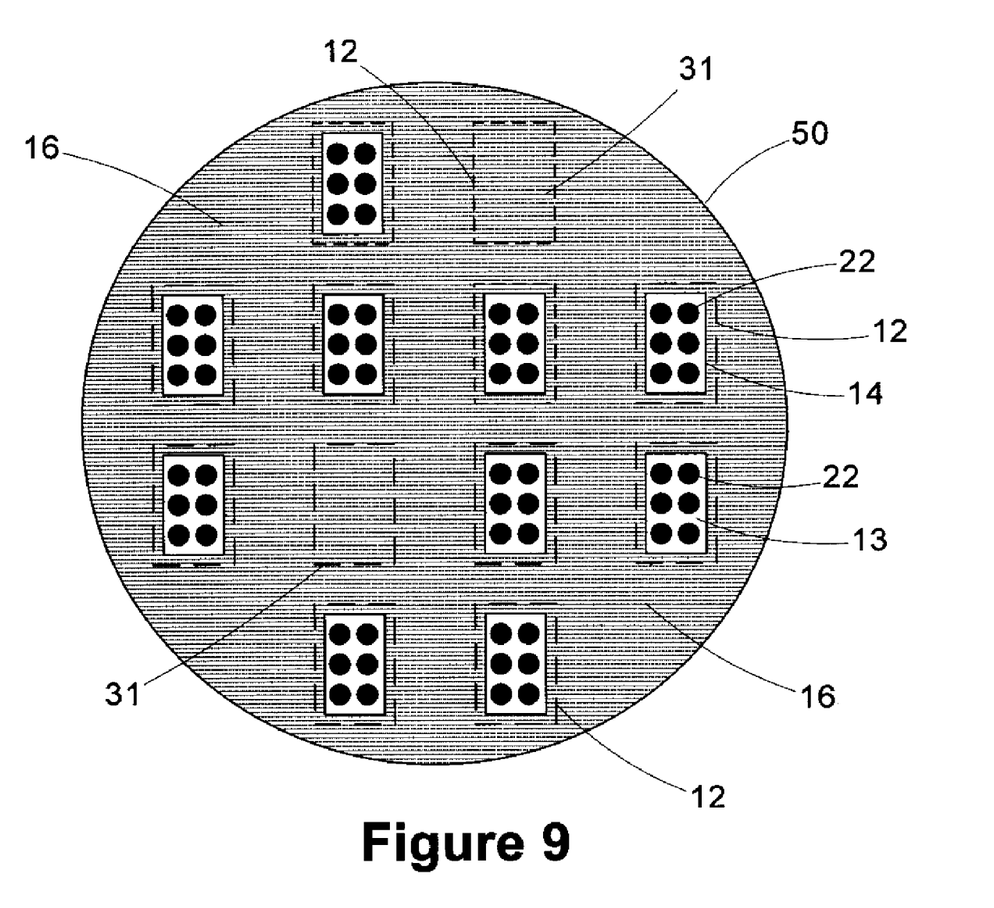

Next, as shown in FIG. 9, an underfill material 16 is used to underfill the spaces between the interposer 14 and the die 12. The underfill material 16 may be applied prior to singulating the die 12, i.e., on a wafer level, or it may be applied after the die 12 are singulated. The underfill material 16 may be comprised of a variety of known materials, and it may be applied using a variety of known techniques. In the depicted example, the underfill material 16 is cured and the substrate 50 is subjected to dicing operations where the devices 10 (comprising a die 12 and interposer 14) are singulated, as reflected in FIG. 1. The device 10 may then be attached to the printed circuit board 30 using a variety of known techniques. As set forth above, the solder balls 22 are sized and positioned such that the interposer 14 may be electrically coupled to the printed circuit board 30 without the need to provide underfill 16 between the interposer 14 and the printed circuit board 30.

What is claimed:

1. A method, comprising:
   operatively coupling an interposer to a die comprising an integrated circuit, the interposer having a smaller footprint than that of the die and the interposer being symmetrically positioned relative to the die such that spacing between die edges and adjacent interposer edges is uniform; and
   filling a space between the interposer and the die with an underfill material.

2. The method of claim 1, further comprising operatively coupling the interposer to a printed circuit board.

3. The method of claim 2, wherein the printed circuit board is a printed circuit board for a multi-chip module.

4. The method of claim 2, wherein the step of operatively coupling the interposer to the printed circuit board is performed such that a space between the interposer and the printed circuit board is free of any underfill material.

5. The method if claim 4, further comprising operatively coupling at least one additional die to the printed circuit board.

6. A method, comprising:
forming a plurality of interposers;
operatively coupling a single interposer to each of a plurality of die on a substrate prior to singulating the plurality of die, each of the die comprising an integrated circuit; wherein the interposer having a smaller footprint than that of the die; and wherein interposer edges on opposite sides of the interposer are spaced apart from corresponding dies edges on opposite sides of the die by a uniform distance; and
introducing an underfill material between the interposers and the plurality of die prior to singulating the plurality of die.

7. The method of claim 6, further comprising curing the underfill material.

8. The method of claim 7, further comprising singulating the plurality of die.

9. The method of claim 6, wherein the plurality of die on the substrate comprise a plurality of known-good-die and wherein an interposer is only operatively coupled to a known-good-die.

10. The method of claim 6, wherein forming the plurality of interposers comprises forming the plurality of interposers from a single panel of material.

11. The method of claim 6, wherein forming the plurality of interposers comprises forming a plurality of conductive connections for a plurality of interposers on a panel of material and, after the conductive connections are formed, cutting the panel of material to singulate the interposers.

12. A device, comprising:
a die comprising an integrated circuit;
an interposer that is coupled to the die, the interposer having a smaller footprint than that of the die, and the interposer being positioned relative to the die such that spacing between edges of the interposer and corresponding edges of the die is equal;
an underfill material between the interposer and the die; and p1 a printed circuit board comprising at least one additional die that is operatively coupled to the printed circuit board, wherein the interposer is operatively coupled to the printed circuit board, and wherein a space between the interposer and the printed circuit board is free of any underfill material.

13. A device, comprising:
a die comprising an integrated circuit, the die having a plurality of die edges; and
an interposer that is coupled to the die, wherein the interposer has a footprint defined by a plurality of interposer edges, the footprint of the interposer being less than that of the die and the interposer being symmetrically positioned relative to the die such that spacing between die edges and adjacent interposer edges is uniform.

14. The device of claim 13, further comprising a printed circuit board comprising at least one additional die operatively coupled to the printed circuit board, wherein the interposer is operatively coupled to the printed circuit board.

15. The device of claim 14, wherein a space between the interposer and the printed circuit board is free of any underfill material.

16. The device of claim 14, wherein the interposer is electrically coupled to the printed circuit board by a plurality of solder balls.

17. The device of claim 16, wherein a space between the interposer and the printed circuit board is free of any underfill material.

18. The device of claim 13, further comprising an underfill material positioned between the interposer and the die.

19. The device of claim 13, wherein the die is electrically coupled to the interposer by a plurality of solder balls.

20. A device, composing:
a die comprising an integrated circuit, the die having a major surface bounded by die edges defining a first surface area; and
an interposer that is coupled to the die, the interposer having a major interposer surface bounded by interposer edges defining a second area, wherein the second area is less than the first area, and wherein interposer edges on opposite sides of the interposer are spaced apart from corresponding dies edges on opposite sides of the die by a uniform distance.

21. The device of claim 20, further comprising a printed circuit board comprising at least one additional die operatively coupled to the printed circuit board, wherein the interposer is operatively coupled to the printed circuit board.

22. The device of claim 21, wherein a space between the interposer and the printed circuit board is free of any underfill material.

23. The device of claim 21, wherein the interposer is electrically coupled to the printed circuit board by a plurality of solder balls.

24. The device of claim 23, wherein a space between the interposer and the printed circuit board is free of any underfill material.

25. The device of claim 20, further comprising an underfill material positioned between the interposer and the die.

26. The device of claim 20, wherein the die is electrically coupled to the interposer by a plurality of solder balls.

* * * * *

UNITED STATES PATENT AND TRADEMARK OFFICE
CERTIFICATE OF CORRECTION

PATENT NO. : 7,659,151 B2  Page 1 of 1
APPLICATION NO. : 11/734497
DATED : February 9, 2010
INVENTOR(S) : David J. Corisis et al.

It is certified that error appears in the above-identified patent and that said Letters Patent is hereby corrected as shown below:

In column 5, line 5, in Claim 5, delete "if" and insert -- of --, therefor.

In column 5, lines 37-50, in Claim 12, delete "12. A device, comprising:
a die comprising an integrated circuit;
an interposer that is coupled to the die, the interposer having a smaller footprint than that of the die, and the interposer being positioned relative to the die such that spacing between edges of the interposer and corresponding edges of the die is equal;
an underfill material between the interposer and the die; and p1 a printed circuit board comprising at least one additional die that is operatively coupled to the printed circuit board, wherein the interposer is operatively coupled to the printed circuit board, and wherein a space between the interposer and the printed circuit board is free of any underfill material." and
insert -- 12. A device, comprising:
a die comprising an integrated circuit;
an interposer that is coupled to the die, the interposer having a smaller footprint than that of the die, and the interposer being positioned relative to the die such that spacing between edges of the interposer and corresponding edges of the die is equal;
an underfill material between the interposer and the die; and
a printed circuit board comprising at least one additional die that is operatively coupled to the printed circuit board, wherein the interposer is operatively coupled to the printed circuit board, and wherein a space between the interposer and the printed circuit board is free of any underfill material. --, therefor.

Signed and Sealed this

Eighteenth Day of May, 2010

David J. Kappos
*Director of the United States Patent and Trademark Office*